United States Patent
Chen et al.

(10) Patent No.: US 6,277,736 B1
(45) Date of Patent: Aug. 21, 2001

(54) METHOD FOR FORMING GATE

(75) Inventors: L. Y. Chen; Heinz Shih; Wen-Yi Hsieh, all of Hsinchu; Tsu-An Lin, Taichung, all of (TW)

(73) Assignee: United Microelectronics, Corp., Hsinchu (TW)

( * ) Notice: Subject to any disclaimer, the term of this patent is extended or adjusted under 35 U.S.C. 154(b) by 0 days.

(21) Appl. No.: 09/206,884

(22) Filed: Dec. 8, 1998

(51) Int. Cl.[7] .................................................. H01L 21/44
(52) U.S. Cl. ..................... 438/653; 438/655; 438/711; 438/714; 438/592; 438/303
(58) Field of Search .................................. 438/653, 655, 438/636, 592–595, 714, 709–711, 706, 719, 721, 700, 303–304

(56) References Cited

U.S. PATENT DOCUMENTS

| 5,654,570 | * | 8/1997 | Agnello | 257/338 |
| 5,948,703 | * | 9/1999 | Shen et al. | 438/714 |
| 5,977,601 | * | 11/1999 | Yang et al. | 257/437 |
| 6,015,997 | * | 1/2000 | Hu et al. | 257/412 |

* cited by examiner

Primary Examiner—Tuan H. Nguyen
Assistant Examiner—Thanh Nguyen

(57) ABSTRACT

A method for forming a gate. A gate oxide layer, a polysilicon layer and a barrier layer are subsequently formed on a substrate, on which an isolation structure is formed. A conductive layer is formed on the barrier layer by sputtering deposition using titanium silicide with a low silicon content as a target. A rapid thermal process (RTP) is performed to remove the polymer nodule formed by sputtering deposition. An anti-reflection layer is formed on the conductive layer. The anti-reflection layer, the conductive layer and the barrier layer are patterned by the etchant composed of chlorine/nitrogen/hexafluoroethane until the polysilicon layer is exposed. Using the anti-reflection layer, the conductive layer and the barrier layer as a mask, the exposed polysilicon layer and the gate oxide layer underlying the exposed polysilicon layer are removed by the etchant composed of chlorine/hydrogen bromide/helium/oxygen until the substrate is exposed and a gate is formed.

8 Claims, 2 Drawing Sheets

METHOD FOR FORMING GATE

BACKGROUND OF THE INVENTION

1. Field of Invention

The present invention relates to a method for fabricating a semiconductor device. More particularly, the present invention relates to a method for forming a gate in a metal oxide semiconductor (MOS) transistor.

2. Description of Related Art

A thin alloy film formed by sputtering deposition is widely used to fabricate electrodes, interconnects, barrier layers and thin film transistors. The materials of the electrode in a MOS transistor comprise, for example, a silicide layer and a polysilicon layer, wherein the silicide layer includes high melting point metals, such as tungsten ails silicide, molybdenum silicide and titanium silicide.

Sputtering deposition includes the following steps. First, the background pressure of the chamber is pumped to a vacuum of about $10^{-7}$ Torr. An inert gas, such as argon (Ar), is introduced into the chamber, and the pressure of the chamber is maintained at about $10^{-3}$ Torr. A metal target disposed at a cathode is bombarded by the argon ions generated by DC discharge and affected by a magnetic field applied to the chamber. The atoms in the surface of the metal target are sputtered and deposited on the substrate to form a metal thin film.

Processes with a critical dimension under 0.25 micron have widely used titanium silicide due to the lower resistivity compared to that of tungsten silicide. Titanium silicide is typically denoted by $TiSi_x$, in which X is dependent on the temperature, the pressure and other conditions while forming the alloy. If the X is greater than 2.4. polymer nodules are easily formed to cause some problems in the following step of etching. For example, while using chlorine as an etching gas to define a gate, the etching rate of titanium silicide is fast. On the contrary, the effect of anisotropic etching using chlorine as an etchant is relatively inferior. As a consequence, the sidewall of titanium silicide is over etched to affect the profile of the gate. While chlorine/hexafluoroethane ($Cl_2/C_2F_6$) is used as the etchant, a better gate profile is obtained, however, since the polymer nodule of titanium silicide is hard to remove, a longer etching time is required.

SUMMARY OF THE INVENTION

Accordingly, the present invention provides a method for forming a gate of a MOS transistor. The gate comprises a titanium silicide layer with a low resistivity. Moreover, by changing the component of an etching gas, the titanium silicide layer is easier etched with a better profile compared to the profile formed by the conventional method.

To achieve these and other advantages and in accordance with the purpose of the invention, as embodied and broadly described herein, the invention provides a method for forming a gate. A gate oxide layer, a polysilicon layer and a barrier layer are sequentially formed on a substrate, on which an isolation structure is formed. A conductive layer is formed on the barrier layer by sputtering deposition using titanium silicide with a low silicon content as a target. A rapid thermal process (RTP) is performed to remove the polymer nodule formed by sputtering deposition. An anti-reflection layer is formed on the conductive layer. The anti-reflection layer, the conductive layer and the barrier layer are patterned by with an etchant comprising chlorine/nitrogen/hexafluoroethane ($Cl_2/N_2/C_2F_6$) until the polysilicon layer is exposed. Using the anti-reflection layer, the conductive layer and the barrier layer as a mask, the exposed polysilicon layer and the gate oxide layer underlying the exposed polysilicon layer are removed using an etchant comprising chlorine/hydrogen bromide/helium/oxygen ($Cl_2/HBr/He/O_2$). Etching is performed until the substrate is exposed and a gate is formed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawing illustrate embodiments of the invention and, together with the description, serve to explain the principles of the invention. In the drawings.

DESCRIPTION OF THE PREFERRED EMBODIMENTS

Figure 1:
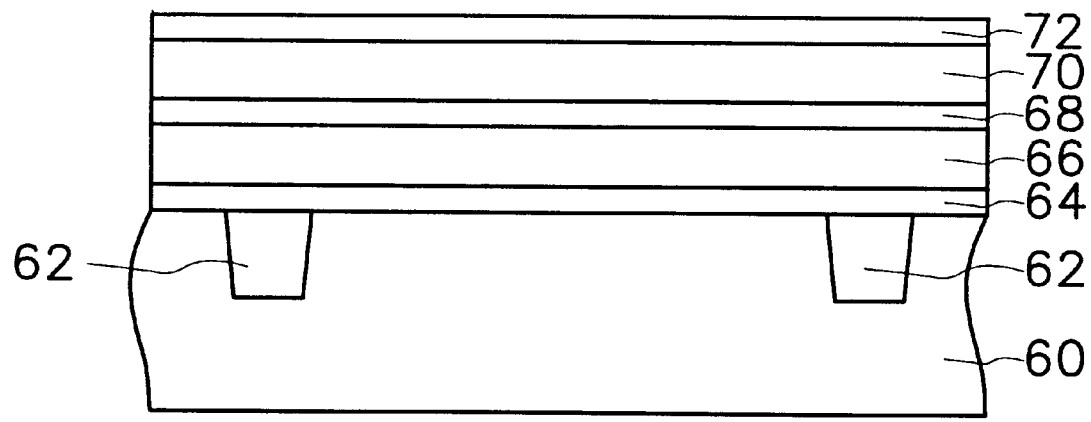
FIGS. 1–4 are cross-sectional views schematically illustrating a fabrication process for forming a gate according to a preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1–4 are cross-sectional views schematically illustrating a fabrication process for forming a gate according to a preferred embodiment of the present invention.

Referring to FIG. 1, an isolation structure 62 is formed on a substrate 60. The surface of the substrate 62 is cleaned, for example, by rinsing with an organic solvent. A gate oxide layer 64 is formed over the substrate 60 by, for example, dry oxidation, wherein the substrate 60 is placed in a furnace for thermal oxidation. The thickness of the gate oxide layer 64 is about 100 Å to 200 Å. A polysilicon layer 66 is formed over the gate oxide layer 64 by, for example, low-pressure chemical vapor deposition (LPCVD). The thickness of the polysilicon layer 66 is about 2000 Å to 3000 Å. A barrier layer 68 is formed over the polysilicon layer 66 to prevent the conductive material formed by the subsequent procedures from diffusing into the polysilicon layer 66. The material of the barrier layer 68 includes, for example, titanium nitride. The barrier layer 68 is formed by, for example, reactive sputtering deposition. The reactant gas for reactive sputtering deposition comprises argon and nitrogen. Preferably, a titanium target is used in the reactive sputtering deposition. The thickness of the barrier layer 68 is about 500 Å to 1000 Å. A conductive layer 70 is formed over the barrier layer 68 by, for example, reactive sputtering deposition. The material of the conductive layer includes, for example, titanium silicide ($TiSi_x$), wherein the X is preferably about 2.1. A thermal treatment process, such as rapid thermal process RTP), is performed to remove polymer nodules formed on the conductive layer 70 by sputtering deposition. An anti-reflection layer 72 is formed over the conductive layer 70 by, for example, plasma enhanced chemical vapor deposition (PECVD). The material of the anti-reflection layer 72 includes silicon oxysitride (SiON), and the reactant gas used in PFCVD comprises nitrous oxide/silane/nitrogen ($N_2O/SiH_4/N_2$).

Figure 2:
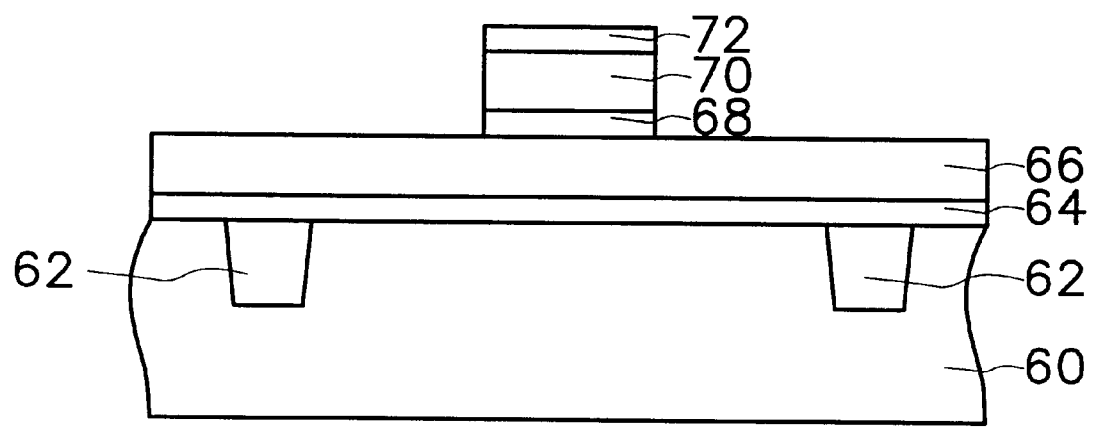

Referring to FIG. 2, the anti-reflection layer 72, the conductive layer 70 and the barrier layer 68 arc patterned. A part of these layers is removed by, for example, dry etching with an etchant comprising chlorine/nitrogen/hexafluoroethane ($Cl_2/N_2/C_2F_6$) until the polysilicon layer 66 is exposed.

Figure 3:
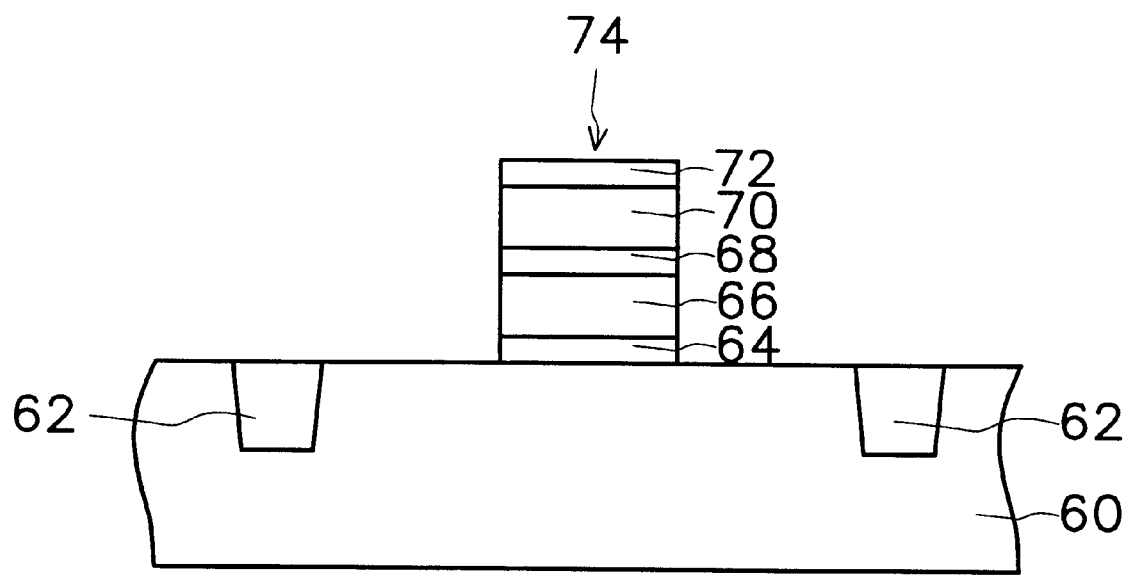

Referring to FIG. 3, using the patterned anti-reflection layer 72, the patterned conductive layer 70 and the patterned barrier layer 68 as a mask, the exposed polysilicon layer 66 and the gate oxide layer 64 underlying the exposed polysilicon layer 66 are removed until the substrate 60 is exposed. A gate 74 comprising the patterned anti-reflection layer 72, the patterned conductive layer 70, the patterned barrier layer 68, the patterned polysilicon layer 66 and the patterned gate oxide layer 64 is thus formed. The exposed portion of the polysilicon layer 66 and the underlying gate oxide layer 64 are removed by, for example, dry etching with an etchant comprising chlorine/hydrogen bromide/helium/oxygen ($Cl_2/HBr/He/O_2$).

Figure 4:
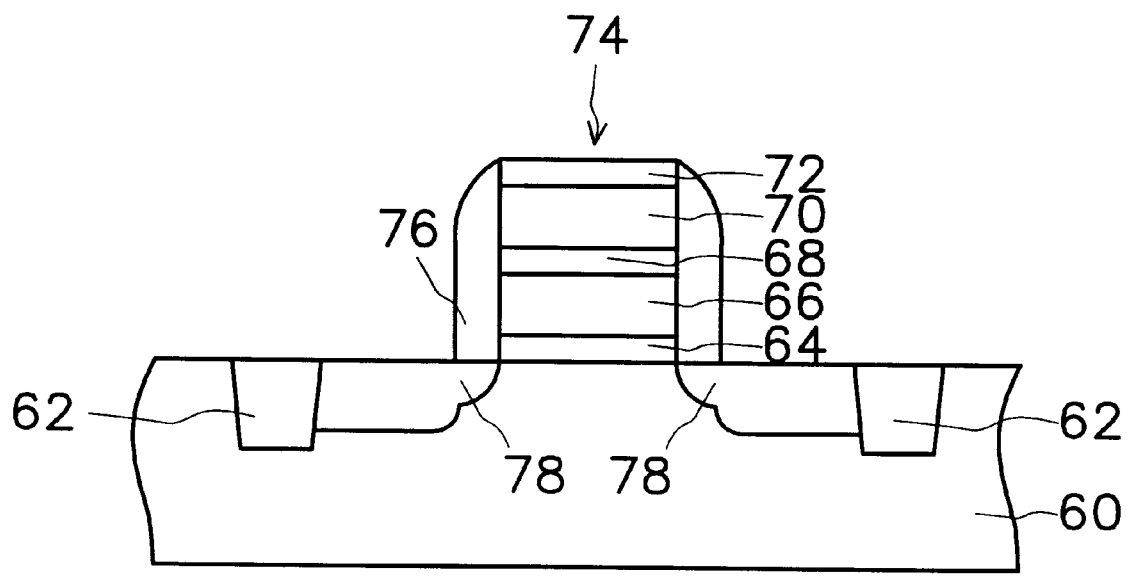

Referring to FIG. 4, a MOS transistor is formed by the conventional procedures such as lightly doping, spacer forming, heavily doping and source/drain forming. The step of lightly doping is performed by a prior method. A spacer 76 is formed on the sidewall of the gate 74. Using the gate 74 and the spacer 76 as a mask, a heavy doping step is performed to form the source and drain 78 in the substrate 60.

According to the preferred embodiment of the present invention, the present invention has advantages including:

1. The thin film of titanium silicide, with low resistance and high thermal stability, is formed by sputtering, deposition using titanium silicide with a low silicon content as a target.
2. The rapid thermal process (RTP) effectively removes the polymer nodule in the titanium silicide formed by sputtering deposition.
3. Applying chlorine/nitrogen/hexafluoroethane ($Cl_2/N_2/C_2F_6$) and chlorine/hydrogen bromide/helium/oxygen ($Cl_2/HBr/He/O_2$) as the etchants for etching titanium silicide and polysilicon respectively, the etching efficiency and the gate profile can be improved simultaneously.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. The method for forming a gate on a substrate, comprising the steps of:

forming a gate oxide layer on the substrate;

forming a polysilicon layer on the gate oxide layer;

forming a barrier layer on the polysilicon layer;

forming a titanium silicide layer on the barrier layer;

forming an anti-reflection layer on the conductive layer;

removing portions of the anti-reflection layer, the titanium silicide layer and the barrier layer to expose a part of the polysilicon layer with an etchant comprising chlorine, nitrogen and hexafluoroethane; and removing the exposed portion of the polysilicon layer and a portion of the gate oxide layer underlying the exposed portion of the polysilicon layer with an etchant comprising chlorine, hydrogen bromide, helium and oxygen until the substrate is exposed.

2. The method of claim 1, comprising further a step of performing a thermal treatment after the step of forming the titanium silicide layer.

3. The method of claim 2, wherein the thermal treatment process includes a rapid thermal process.

4. The method of claim 1, wherein the barrier layer includes a titanium nitride layer.

5. The method of claim 1, wherein the titanium silicide layer includes a titanium silicide layer.

6. The method of claim 1, wherein the titanium silicide is formed by sputtering deposition using titanium silicide with a silicon content as a target that forms a $TiSi_{2.1}$ layer.

7. The method of claim 1, wherein the anti-reflection layer includes a silicon oxynitride layer.

8. The method of claim 1, after the step of removing the exposed portion of the polysilicon layer and the underlying portion of the gate oxide layer, comprising further the steps of:

forming a spacer on a sidewall of the gate; and forming a source and a drain on the substrate, using the gate and the spacer as a mask.

* * * * *